(12) United States Patent
Cheng et al.

(10) Patent No.: US 9,130,531 B1
(45) Date of Patent: Sep. 8, 2015

(54) SEMICONDUCTOR ARRANGEMENT WITH THERMAL INSULATION CONFIGURATION

(71) Applicant: Taiwan Semiconductor Manufacturing Company Limited, Hsin-Chu (TW)

(72) Inventors: Chun-wen Cheng, Zhubei (TW); Chia-Hua Chu, Zhubei (TW); Yi-Chuan Teng, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/226,897

(22) Filed: Mar. 27, 2014

(51) Int. Cl.
*H01L 21/00* (2006.01)
*H03H 3/007* (2006.01)

(52) U.S. Cl.
CPC .................................. *H03H 3/0073* (2013.01)

(58) Field of Classification Search
CPC ............... H03H 3/0072; H03H 3/0073; H01L 2924/1461; B81B 2207/012; B81C 2203/01; B81C 2203/0109
USPC ........................ 438/50–53; 257/415, 417, 419
See application file for complete search history.

(56) References Cited

U.S. PATENT DOCUMENTS

| | | | |
|---|---|---|---|
| 6,635,509 B1 * | 10/2003 | Ouellet | 438/106 |
| 7,923,790 B1 * | 4/2011 | Quevy et al. | 257/415 |
| 8,258,590 B2 * | 9/2012 | Geiger et al. | 257/415 |
| 8,919,199 B2 * | 12/2014 | Judy et al. | 73/504.12 |

* cited by examiner

*Primary Examiner* — Kevin M Picardat
(74) *Attorney, Agent, or Firm* — Cooper Legal Group, LLC

(57) ABSTRACT

Among other things, one or more semiconductor arrangements and techniques for forming such semiconductor arrangements are provided herein. A semiconductor arrangement comprises a cap wafer, a microelectromechanical systems (MEMS) wafer, and a complementary metal-oxide-semiconductor (CMOS) wafer. The MEMS wafer comprises a thermal insulator air gap formed between a sensing layer and a membrane. An ambient pressure chamber is formed between the CMOS wafer and the membrane of the MEMS wafer. The ambient pressure chamber is configured as a second thermal insulator air gap. The thermal insulator air gap and the second thermal insulator air gap protect portions of the semiconductor arrangement, such as the MEMS wafer, from heat originating from the CMOS wafer, which can otherwise damage such portions of the semiconductor arrangement. In some embodiments, one or more buffer layers are formed over the cap wafer as stress buffers.

20 Claims, 21 Drawing Sheets

SEMICONDUCTOR ARRANGEMENT WITH THERMAL INSULATION CONFIGURATION

BACKGROUND

Complementary metal-oxide-semiconductor (CMOS) is a technology used in constructing integrated circuits, such as image sensors, data converters, communication modules, etc. Many integrated circuits or semiconductor arrangements thus comprise CMOS wafers or at least one or more portions of a wafer whereon CMOS technology is implemented. Heat from a CMOS wafer, such as from outgassing, can damage other portions of a semiconductor arrangement. A semiconductor arrangement can also be damaged from stress, such as printed circuit board stress. For example, stress-induced solder joint failure can occur from such stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
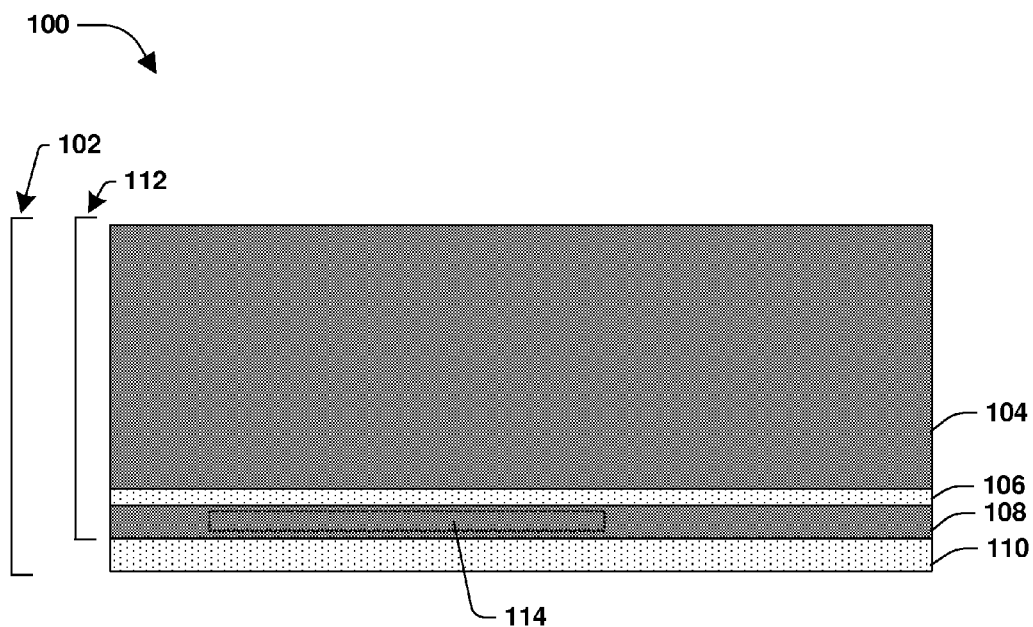
FIG. 1 is an illustration of a semiconductor arrangement comprising a microelectromechanical systems (MEMS) wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and techniques for forming such semiconductor arrangements are provided. In some embodiments, a semiconductor arrangement comprises a complementary metal-oxide-semiconductor (CMOS) wafer. A microelectromechanical systems (MEMS) wafer is formed over the CMOS wafer. The MEMS wafer comprises a first thermal insulator air gap between a sensing layer, such as a sensing electrode, and a membrane of the MEMS wafer. A cap wafer is formed over the MEMS wafer. In some embodiments, a pressurized chamber is formed within the cap wafer and the MEMS wafer, and an ambient pressure chamber is formed between the MEMS wafer and the CMOS wafer, such that the pressurized chamber is formed over the ambient pressure chamber. The pressurized chamber has a pressure that is different than an ambient air pressure, such as within the ambient pressure chamber. In some embodiments, the ambient pressure chamber is formed within the cap wafer and the MEMS wafer, and the pressurized chamber is formed between the MEMS wafer and the CMOS wafer, such that the ambient pressure chamber is formed over the pressurized chamber. The ambient pressure chamber is configured as a second thermal insulator air gap between the CMOS wafer and the membrane. In this way, the first thermal insulator air gap and the second thermal insulator air gap insulate the MEMS wafer from heat originating from the CMOS wafer, which can otherwise cause damage to the MEMS wafer. In some embodiments, a stress buffer for the semiconductor arrangement, such as a polybenzoxazole or other molding material, is formed over the cap wafer. In some embodiments, the membrane of the MEMS wafer can move with respect to the sensing layer, such as away from heat sources of the CMOS wafer.

As illustrated in FIG. 1, a MEMS wafer 102 of a semiconductor arrangement 100 is formed. In some embodiments, the MEMS wafer 102 comprises a silicon-on-insulator (SOI) wafer 112. The SOI wafer 112 comprises a first silicon layer 104, a first oxide layer 106, and a second silicon layer 108. The second silicon layer 108 comprises a membrane 114. A second oxide layer 110 of the MEMS wafer 102 is deposited on the second silicon layer 108. In some embodiments, the second oxide layer 110 is formed to a thickness between about 0.1 um to about 10 um.

Figure 2:
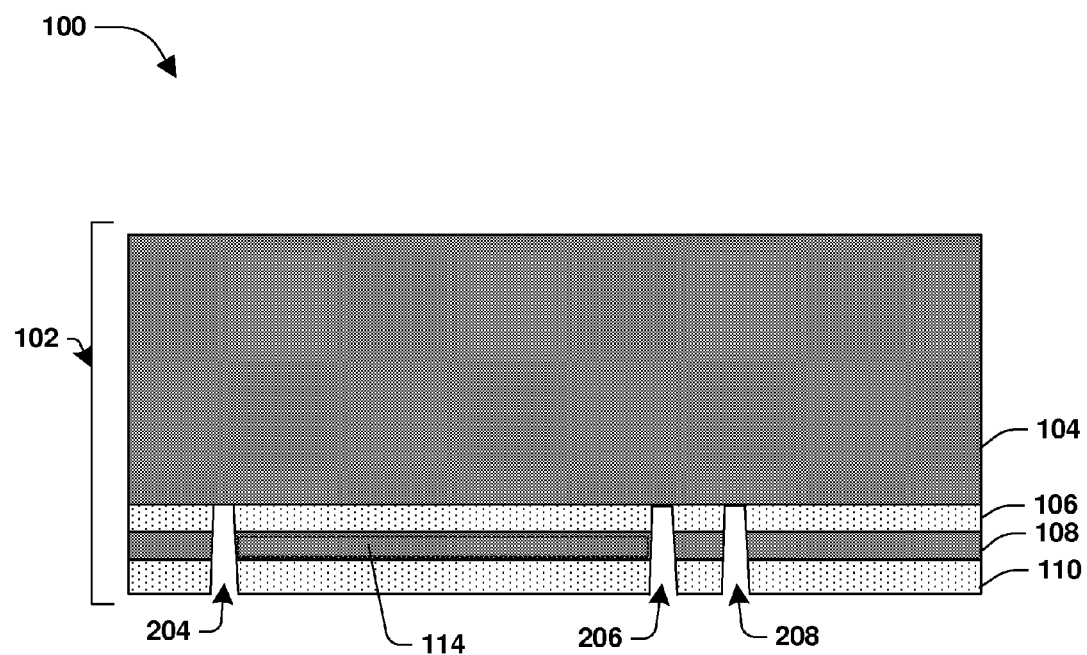
FIG. 2 is an illustration of a semiconductor arrangement comprising a microelectromechanical systems (MEMS) wafer, in accordance with some embodiments.

As illustrated in FIG. 2, one or more trenches are formed as part of establishing structures that serve as etch stops for a subsequent hydrogen fluoride (HF) etch. In some embodiments, an etching process is performed to form at least one of a first trench 204, a second trench 206, a third trench 208 or other trenches within the second oxide layer 110, the second silicon layer 108, and the first oxide layer 106. In some embodiments, at least some of the etching process comprises deep reactive-ion etching.

Figure 3A:
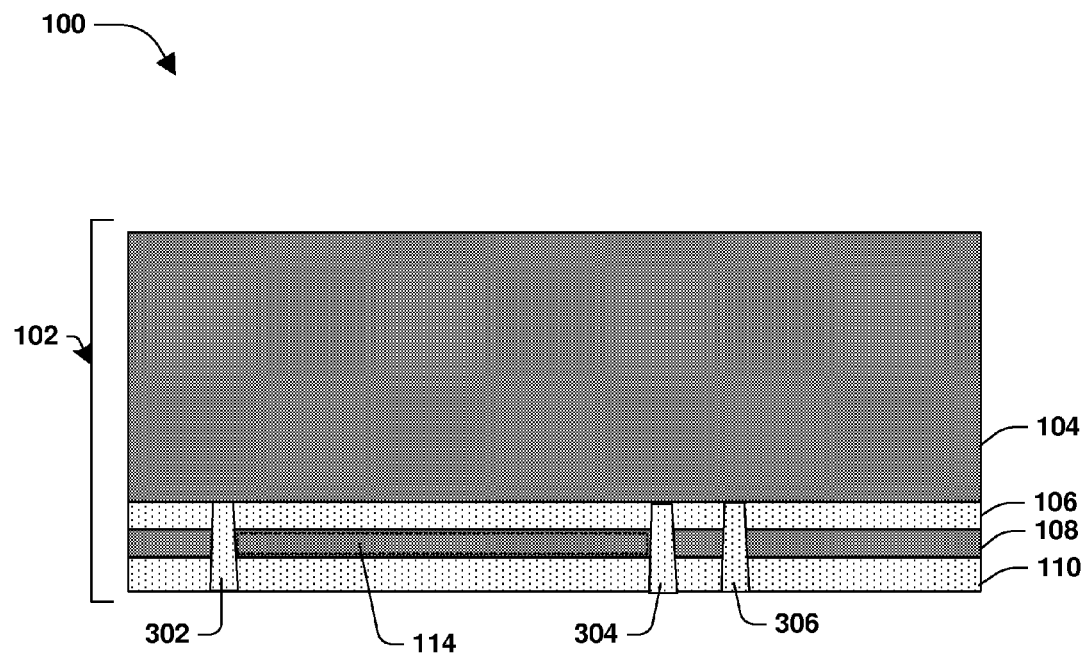
FIG. 3A is an illustration of a semiconductor arrangement comprising a microelectromechanical systems (MEMS) wafer, in accordance with some embodiments.

As illustrated in FIG. 3A, the one or more trenches are filled to form structures, according to some embodiments. In some embodiments, oxide is deposited within the first trench 204 to form a first oxide structure 302, within the second trench 206 to form a second oxide structure 304, and within the third trench 208 to form a third oxide structure 306. In some embodiments, an annealing process is performed at least one of during or after the one or more trenches are filled. In some embodiments, a chemical mechanical polish (CMP) process is performed after the structures are formed to planarize the structures.

Figure 3B:
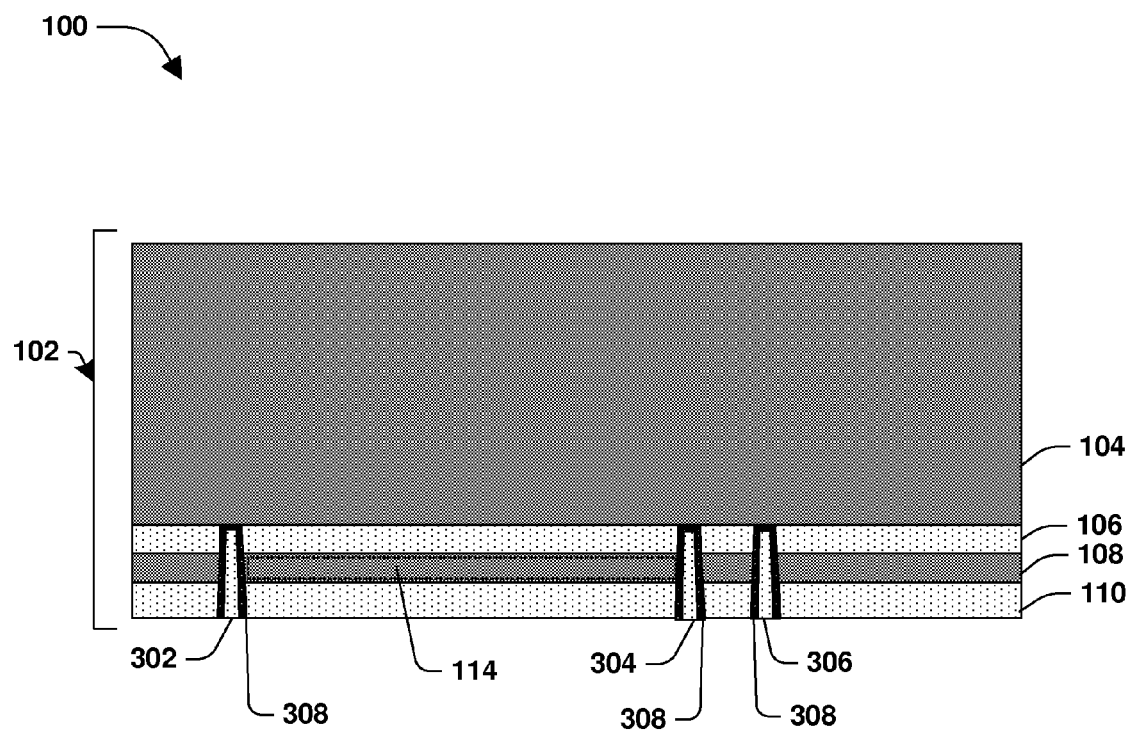
FIG. 3B is an illustration of a semiconductor arrangement comprising a microelectromechanical systems (MEMS) wafer, in accordance with some embodiments.

As illustrated in FIG. 3B, a liner 308 is formed within each of the trenches before the trenches are filled, in accordance with some embodiments. In some embodiments, the liners 308 function as the etch stop layer during the subsequent HF etch. In some embodiments, the liners 308 comprise silicon nitride (SiN). In some embodiments, the liners 308 are each a low stress liner having a film stress of less than about 400 MPa, such as a stress between about 250 MPa to about 0 MPa or less.

Figure 4:
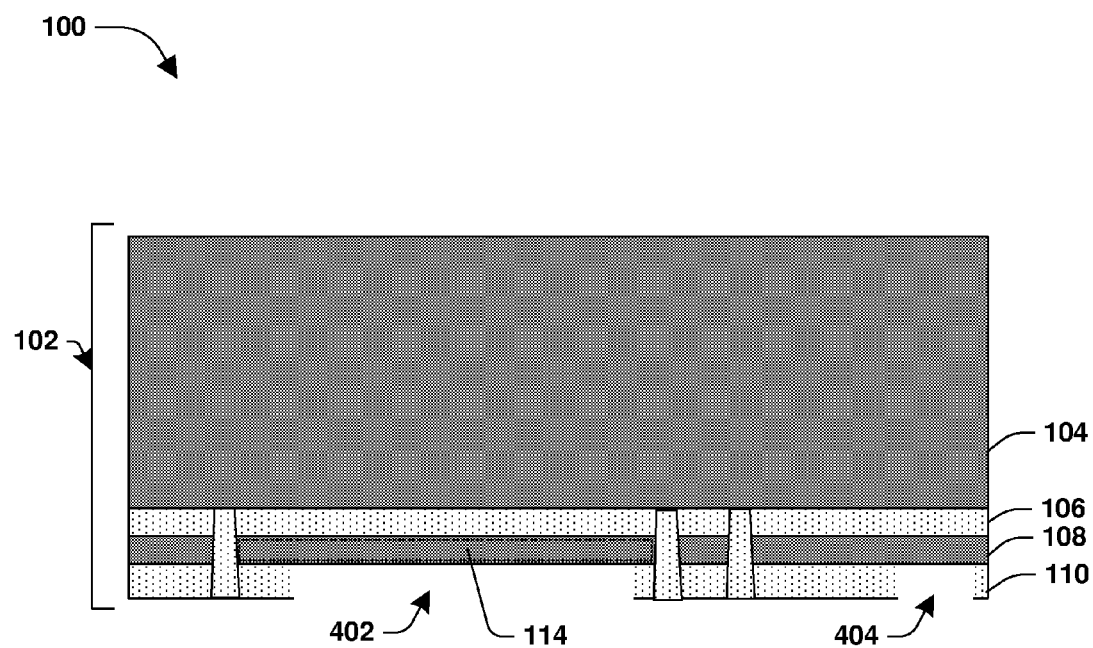
FIG. 4 is an illustration of a semiconductor arrangement comprising a microelectromechanical systems (MEMS) wafer, in accordance with some embodiments.

As illustrated in FIG. 4, an etching process is performed to form at least one of a first cavity 402, a second cavity 404, or other cavities within the second oxide layer 110. In some embodiments, the etching process comprises a cavity wet etch. In some embodiments, the etching process comprises a blanket etch. In some embodiments, at least a portion of the second silicon layer 108 is exposed for bonding.

Figure 5:
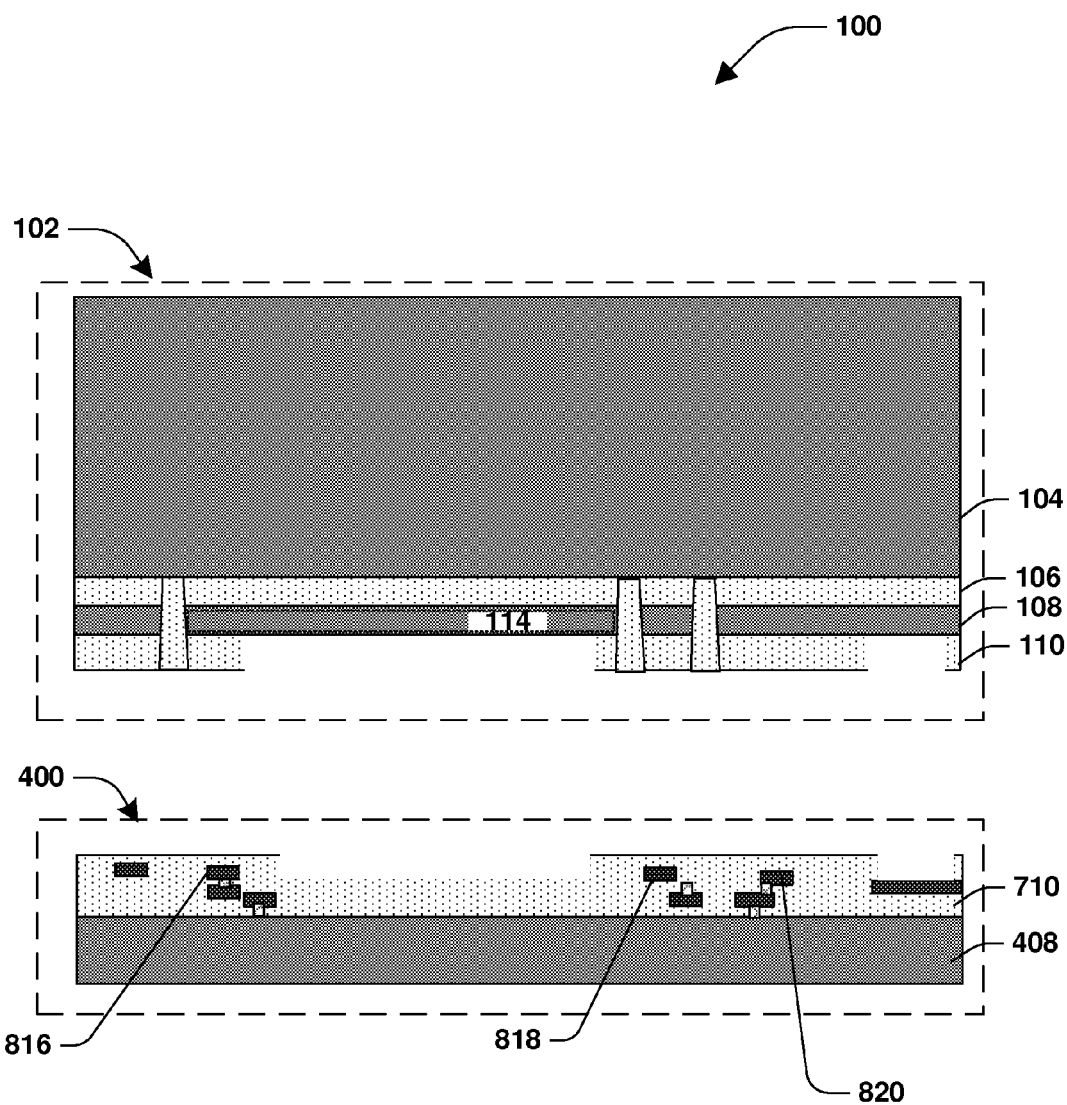
FIG. 5 is an illustration of a semiconductor arrangement comprising a complementary metal-oxide-semiconductor (CMOS) wafer that is to be bonded to a microelectromechanical systems (MEMS) wafer, in accordance with some embodiments.
Figure 6:
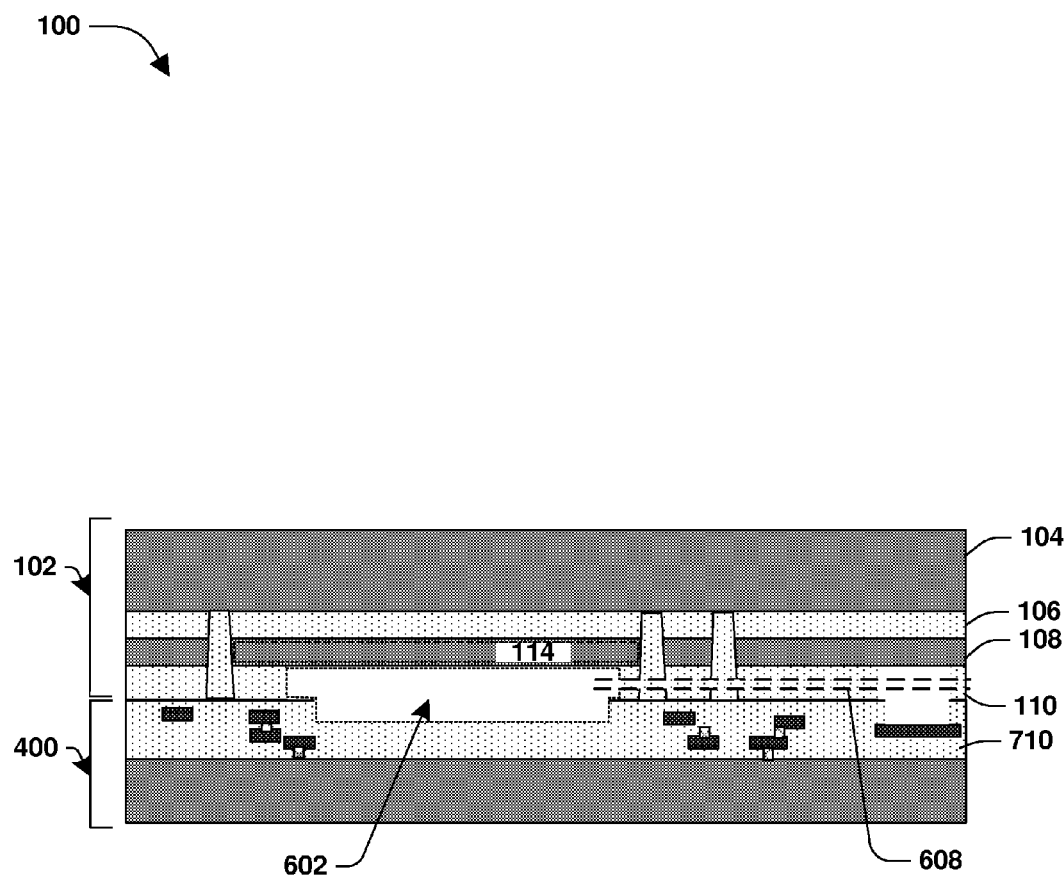
FIG. 6 is an illustration of a semiconductor arrangement comprising a microelectromechanical systems (MEMS) wafer bonded to a complementary metal-oxide-semiconductor (CMOS) wafer, in accordance with some embodiments.

As illustrated in FIGS. 5 and 6, the MEMS wafer 102 is bonded to a complementary metal-oxide-semiconductor (CMOS) wafer 400. The CMOS wafer 400 comprises a silicon layer 408 and an oxide layer 710 formed over the silicon layer 408. The CMOS wafer 400 comprises one or more CMOS metal structures, such as a first CMOS metal structure 816, a second CMOS metal structure 818, and a third CMOS metal structure 820. The CMOS wafer 400 comprises one or more semiconductor structures, such as transistors or integrated circuits. In some embodiments, a fusion bonding technique is performed to fuse the MEMS wafer 102 to the CMOS wafer 400. In some embodiments, the oxide layer 710 is fused to the second oxide layer 110.

As illustrated in FIG. 6, an ambient pressure chamber 602 is formed between the CMOS wafer 400 and the membrane 114 of the MEMS wafer 102. In some embodiments, the ambient pressure chamber 602 is exposed to ambient air surrounding the semiconductor arrangement 100, such as through an ambient pressure channel 608 formed before bonding of the MEMS wafer 102 to the CMOS wafer 400. The ambient pressure channel 608 is a channel that is exposed to the ambient air surrounding the semiconductor arrangement 100. In some embodiments, the ambient pressure chamber 602 is configured or serves as a thermal insulator air gap between the CMOS wafer 400 and the MEMS wafer 102. The thermal insulator air gap is configured or serves to insulate the MEMS wafer 102 from heat originating from the CMOS wafer 400, which otherwise can cause thermal damage to the MEMS wafer 102 such as solder joint failure. As illustrated in FIG. 6, a grinding process or other process, such as CMP, is performed to remove a portion the first silicon layer 104 of the MEMS wafer 102. In some embodiments, the first silicon layer 104 has a thickness between about 10 um to about 100 um after the grinding process.

Figure 7A:
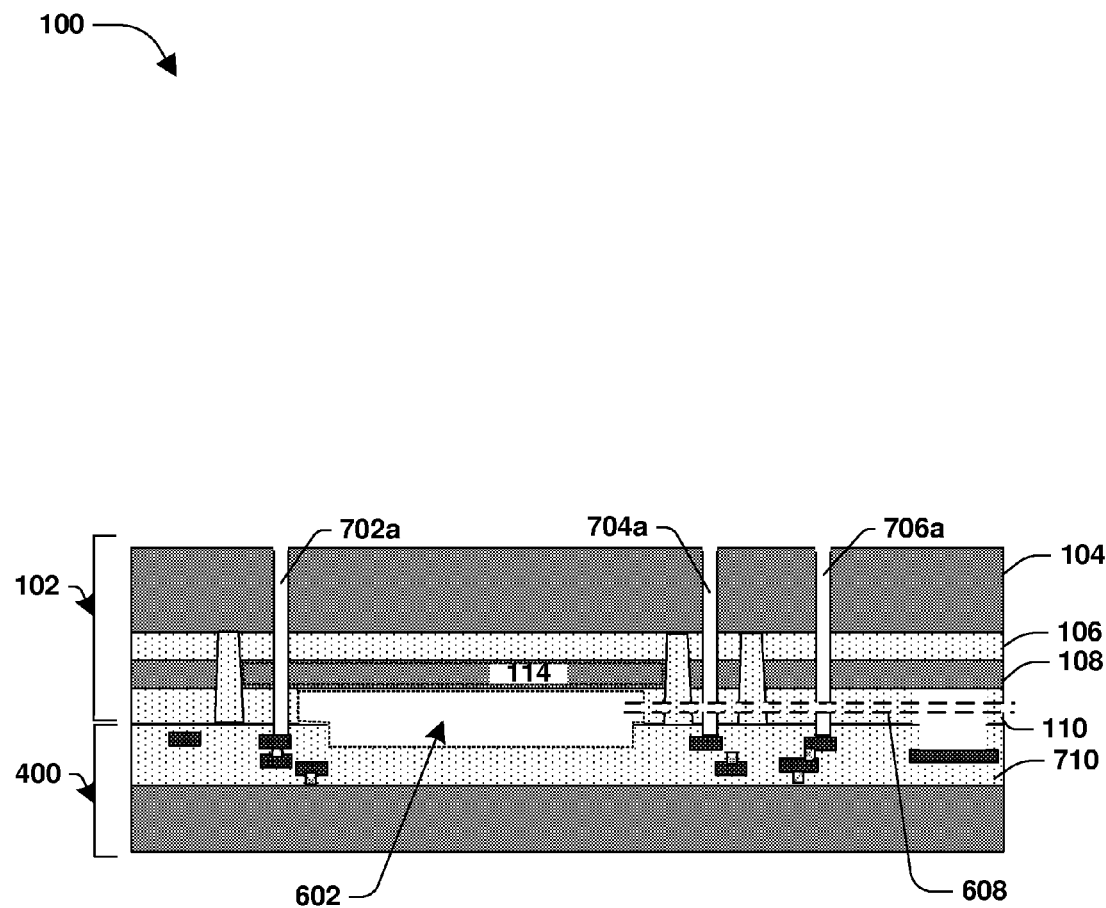
FIG. 7A is an illustration of a semiconductor arrangement comprising a microelectromechanical systems (MEMS) wafer bonded to a complementary metal-oxide-semiconductor (CMOS) wafer, in accordance with some embodiments.

As illustrated in FIG. 7A, an etching process is performed to form one or more trenches, such as a first trench 702a, a second trench 704a, and a third trench 706a, through the first silicon layer 104, the first oxide layer 106, the second silicon layer 108, and the second oxide layer 110 of the MEMs wafer 102. In some embodiments, the etching process removes a portion of the oxide layer 710 of the CMOS wafer 400. In some embodiments, the etching process comprises a deep reactive-ion etching process.

Figure 7B:
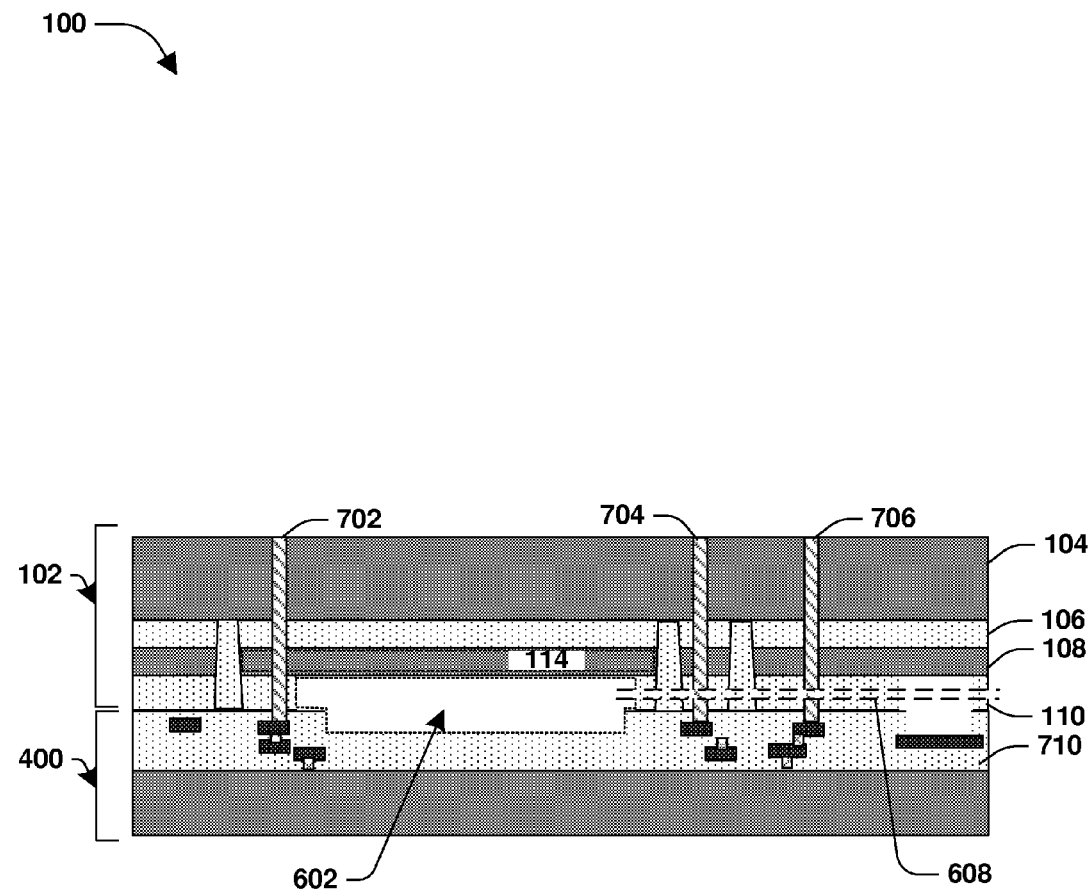
FIG. 7B is an illustration of a semiconductor arrangement comprising a microelectromechanical systems (MEMS) wafer bonded to a complementary metal-oxide-semiconductor (CMOS) wafer, in accordance with some embodiments.

As illustrated in FIG. 7B, a conductive material, such as tungsten or another metal, is deposited within the first trench 702a to form a first tungsten plug 702, within the second trench 704a to form a second tungsten plug 704, and within the third trench 706a to form a third tungsten plug 706. The tungsten plugs are used as connections through the MEMS wafer 102 to the CMOS wafer 400. In some embodiments, the plugs 702, 704, 706 comprise one or more materials other than or in addition to tungsten.

Figure 8:
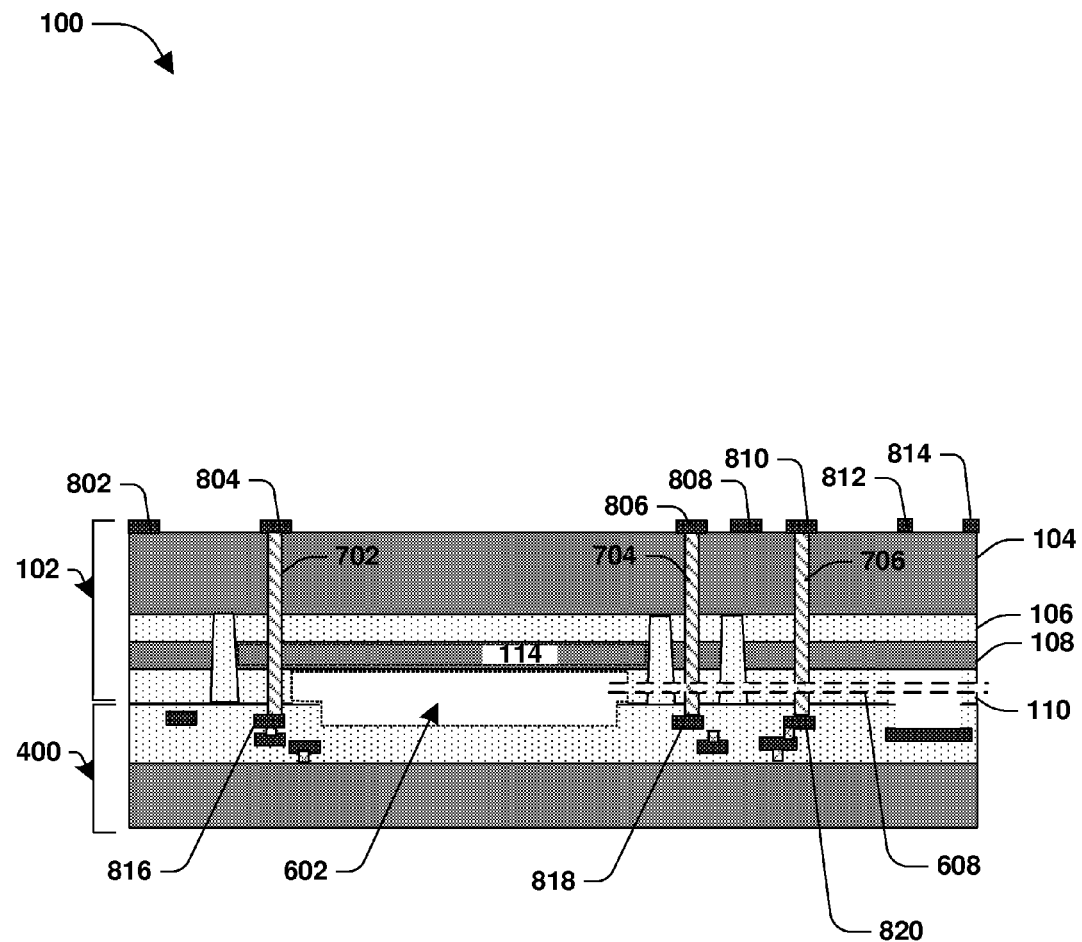
FIG. 8 is an illustration of a semiconductor arrangement comprising a microelectromechanical systems (MEMS) wafer bonded to a complementary metal-oxide-semiconductor (CMOS) wafer, in accordance with some embodiments.

As illustrated in FIG. 8, one or more metal structures, such as a first metal structure 802, a second metal structure 804, a third metal structure 806, a fourth metal structure 808, a fifth metal structure 810, a sixth metal structure 812, and a seventh metal structure 814 are formed on the MEMS wafer 102. In some embodiments, the one or more metal structures 802-814 are formed by patterning a layer of metal. In some embodiments, the one or more metal structures 802-814 comprise metal such as aluminum. The second metal structure 804 provides connectivity to the CMOS wafer 400 through the first tungsten plug 702 to the first CMOS metal structure 816. The third metal structure 806 provides connectivity to the CMOS wafer 400 through the second tungsten plug 704 to the second CMOS metal structure 818. The fifth metal structure 810 provides connectivity to the CMOS wafer 400 through the third tungsten plug 706 to the third CMOS metal structure 820.

Figure 9:
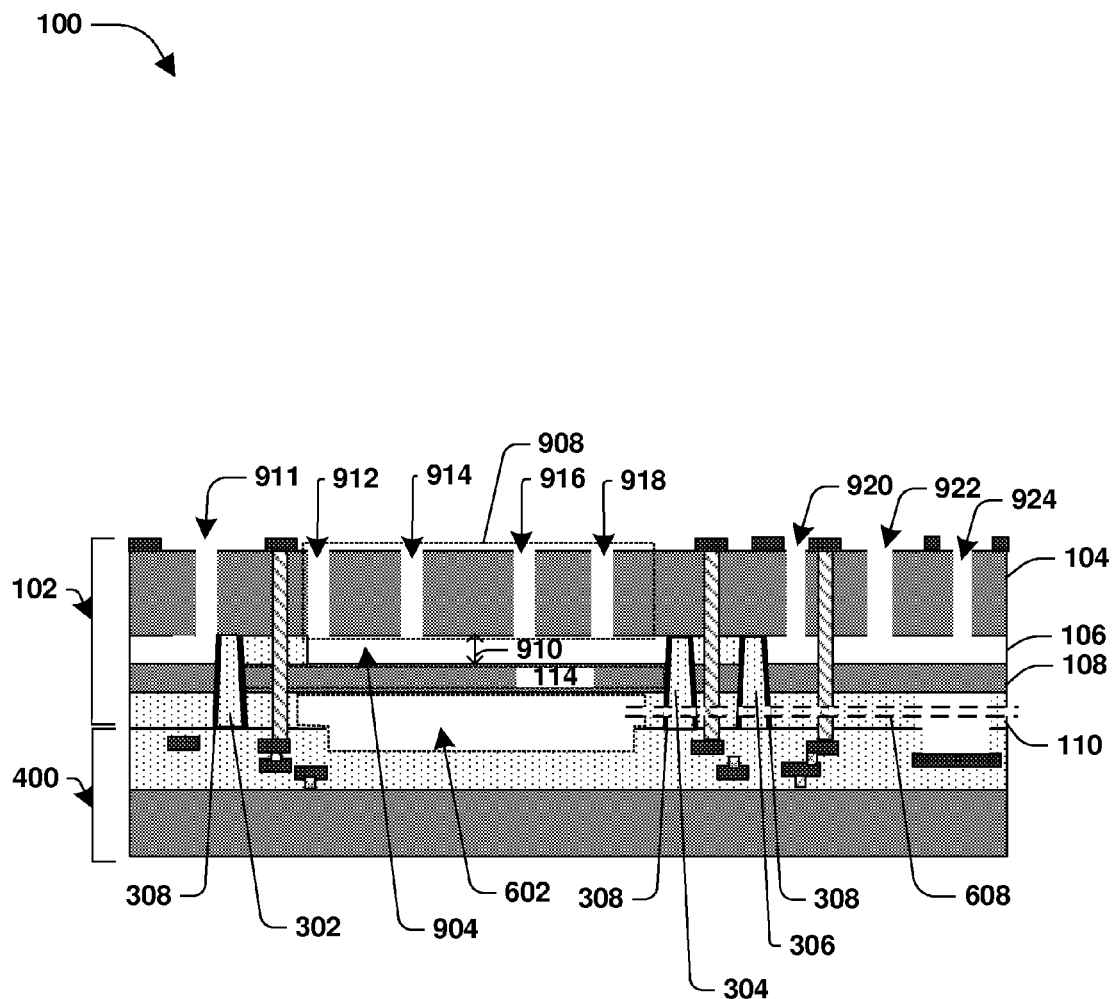
FIG. 9 is an illustration of a semiconductor arrangement comprising a microelectromechanical systems (MEMS) wafer bonded to a complementary metal-oxide-semiconductor (CMOS) wafer, in accordance with some embodiments.

As illustrated in FIG. 9, one or more vias, such as a first via 911, a second via 912, a third via 914, a fourth via 916, a fifth via 918, a sixth via 920, a seventh via 922, and an eighth via 924 are formed within the first silicon layer 104, such as by an etching process. In some embodiments, the etching process comprises deep reactive-ion etching such that at least a portion of the first oxide layer 106 is removed as part of the etching process. In some embodiments, at least some of the etching process comprises the HF etch for lateral etching of the first oxide layer 106. In some embodiments, the silicon nitride liner 308 of the first oxide structure 302, the second oxide structure 304, and the third oxide structure 306 function as etch stops for the HF etching process. In some embodiments the HF etching process comprises a vapor etching process. A thermal insulator air gap 904 is formed between a sensing layer 908 defined by the first silicon layer 104 and the membrane 114 of the MEMS wafer 102. The thermal insulator air gap 904 is configured to insulate the MEMS wafer 102 from heat originating from the CMOS wafer 400, which can otherwise cause thermal damage to the MEMS wafer 102, such as solder joint failure. The thermal insulator air gap 904 comprises or defines a sensing gap 910 between the membrane 114 and the sensing layer 908. Movement of the membrane 114 towards the sensing layer 908 causes the sensing gap 910 to compress or shrink, and movement of the membrane 114 away from the sensing layer 908 causes the sensing gap 910 to decompress or expand. In some embodiments, a first sensing plate (not shown) is coupled to the sensing layer 908, such as a sensing electrode, and a second sensing plate (not shown) is coupled to the membrane 114. As movement of the membrane 114 with respect to the sensing layer 908 causes the first sensing plate and the second sensing plate to move towards or away from one another, the first sensing plate and the second sensing plate provide capacitance or other information used to determine compress/decompression of the sensing gap 910. In some embodiments, the membrane 114 moves, such as bends or flexes, away from the CMOS wafer 400 to separate from CMOS thermal sources within the CMOS wafer 400.

Figure 10:
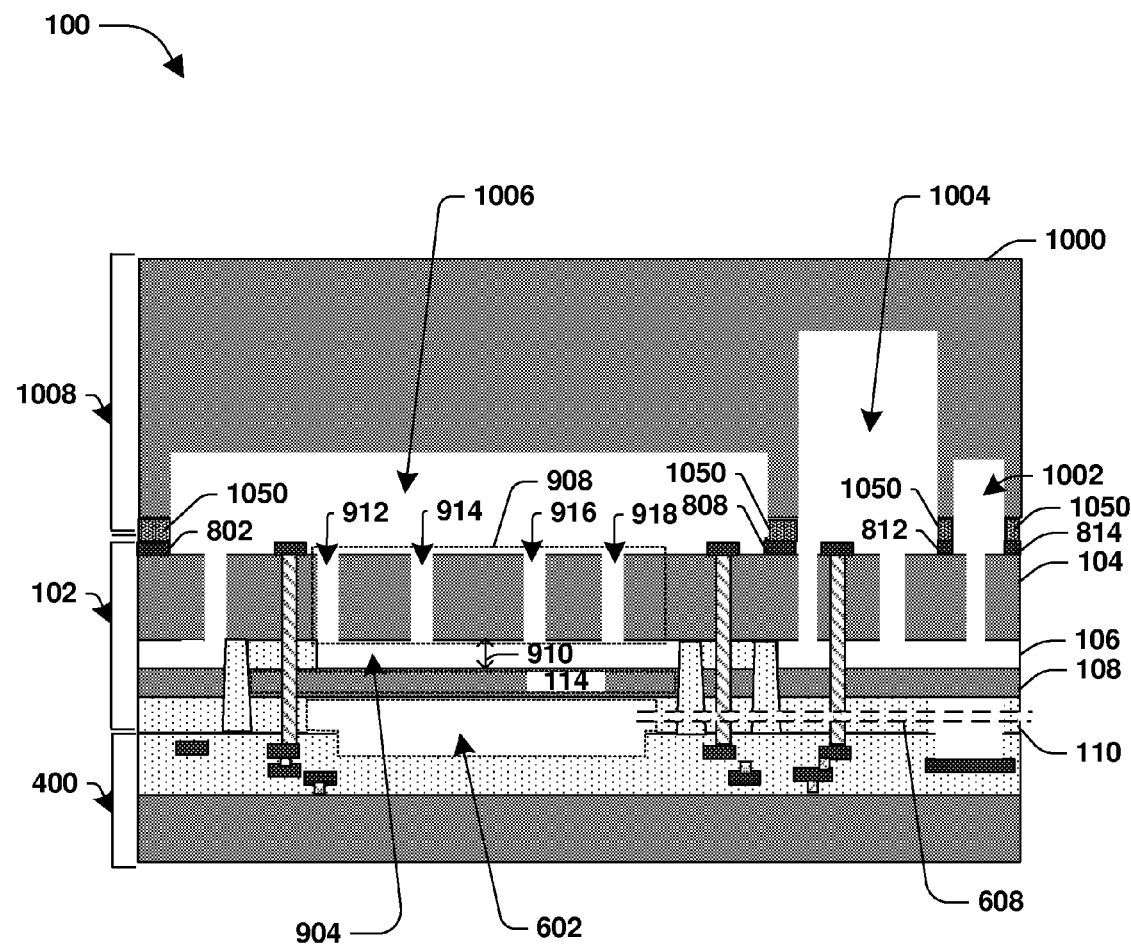
FIG. 10 is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 10, a cap wafer 1008 is bonded to the MEMS wafer 102. In some embodiments, at least one of heat or pressure is used to bond the first metal structure 802, the fourth metal structure 808, the sixth metal structure 812, and the seventh metal structure 814 of the MEMS wafer 102 to a bonding layer 1050 of the cap wafer 1008. In some embodiments, the bonding layer 1050 comprises a bonding material such as metal. The cap wafer 1008 comprises a silicon layer 1000. The cap wafer 1008 also comprises a pressurized chamber 1006 having a pressure different than an ambient air pressure. In some embodiments, a pressure difference is created between the pressurized chamber 1006 and the ambient pressure chamber 602 so that the membrane 114 can move with respect to the sensing layer 908, which compresses or decompresses the sensing gap 910. The pressurized chamber 1006 is coupled to the thermal insulator air gap 904 through one or more channels, such as the second via 912, the third via 914, the fourth via 916, or the fifth via 918, formed through the sensing layer 908. In some embodiments, the cap wafer 1008 comprises or defines a first chamber 1004, a second chamber 1002, or other chambers.

Figure 11:
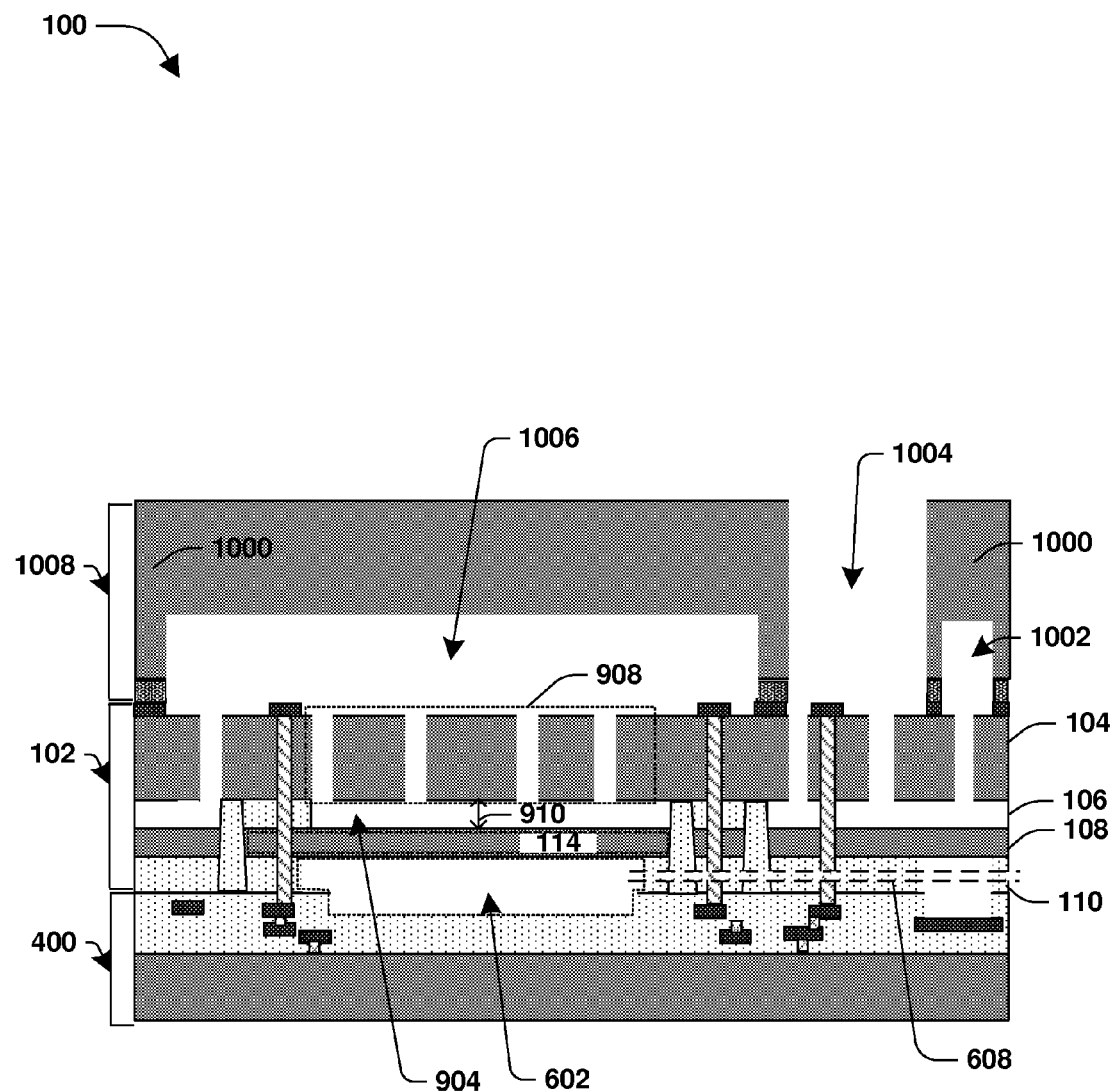
FIG. 11 is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 12:
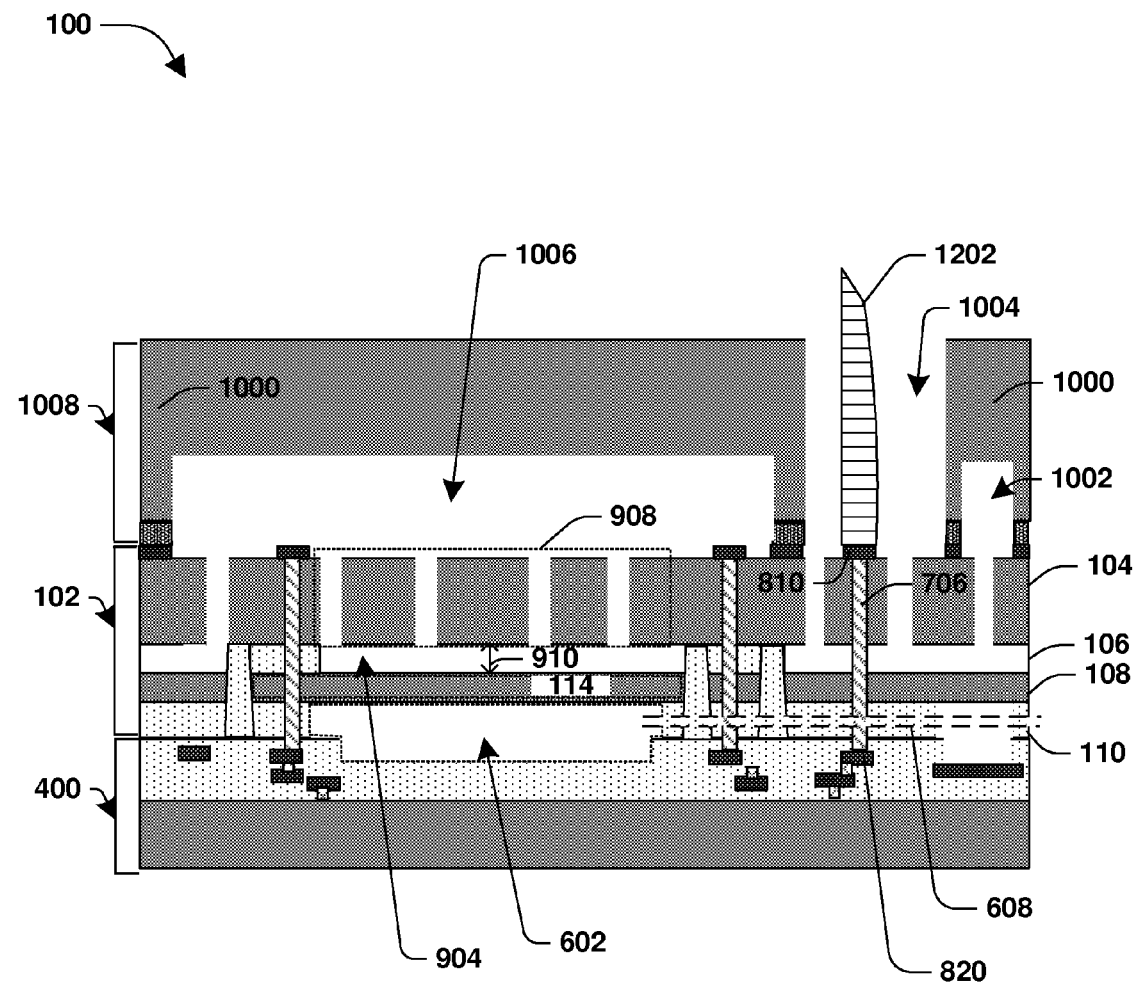
FIG. 12 is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 11, a grinding process or other process, such as CMP, is performed to remove a portion of the silicon layer 1000. The grinding process removes a portion of the silicon layer 1000 over the first chamber 1004 to expose the first chamber 1004. As illustrated in FIG. 12, a metal connection 1202 is formed within the first chamber 1004. In some embodiments, the metal connection 1202 comprises a wire, such as a copper stud or other metal wire structure. The metal connection 1202 provides connectivity to the CMOS wafer 400 through a connection path comprising the fifth metal structure 810, the third tungsten plug 706, and the third CMOS metal structure 820.

Figure 13:
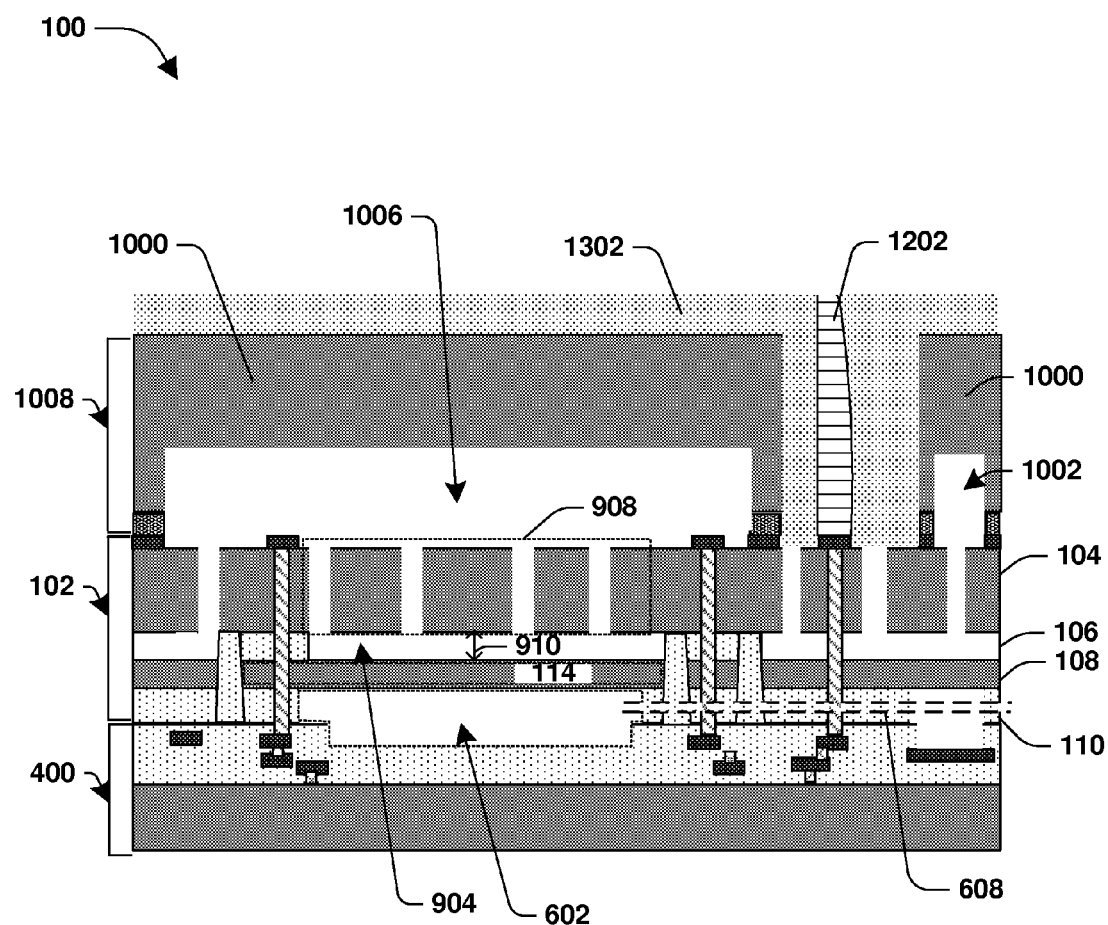
FIG. 13 is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 13, a first buffer layer 1302 is formed over the silicon layer 1000. The first buffer layer 1302 is a stress buffer for the semiconductor arrangement 100. In some embodiments, the first buffer layer 1302 comprises a molding material or other relatively soft material for stress absorption. In some embodiments, the first buffer layer 1302 absorbs external stress, such as stress from a layer or a device (not shown) formed over the first buffer layer 1302, so that at least one of the cap wafer 1008, the MEMS wafer 102, or the CMOS wafer 400 is free or substantially free of the effects of external stress. In some embodiments, the lack of stress allows the arrangement 100 to operate as desired, such as by not having the membrane 114 be (artificially) deflected, and thus the sensing gap 910 compressed/decompressed, by external sources of stress. In some embodiments, a grinding or CMP process is performed to remove a portion of the first buffer layer 1302 and a portion of the metal connection 1202.

Figure 14:
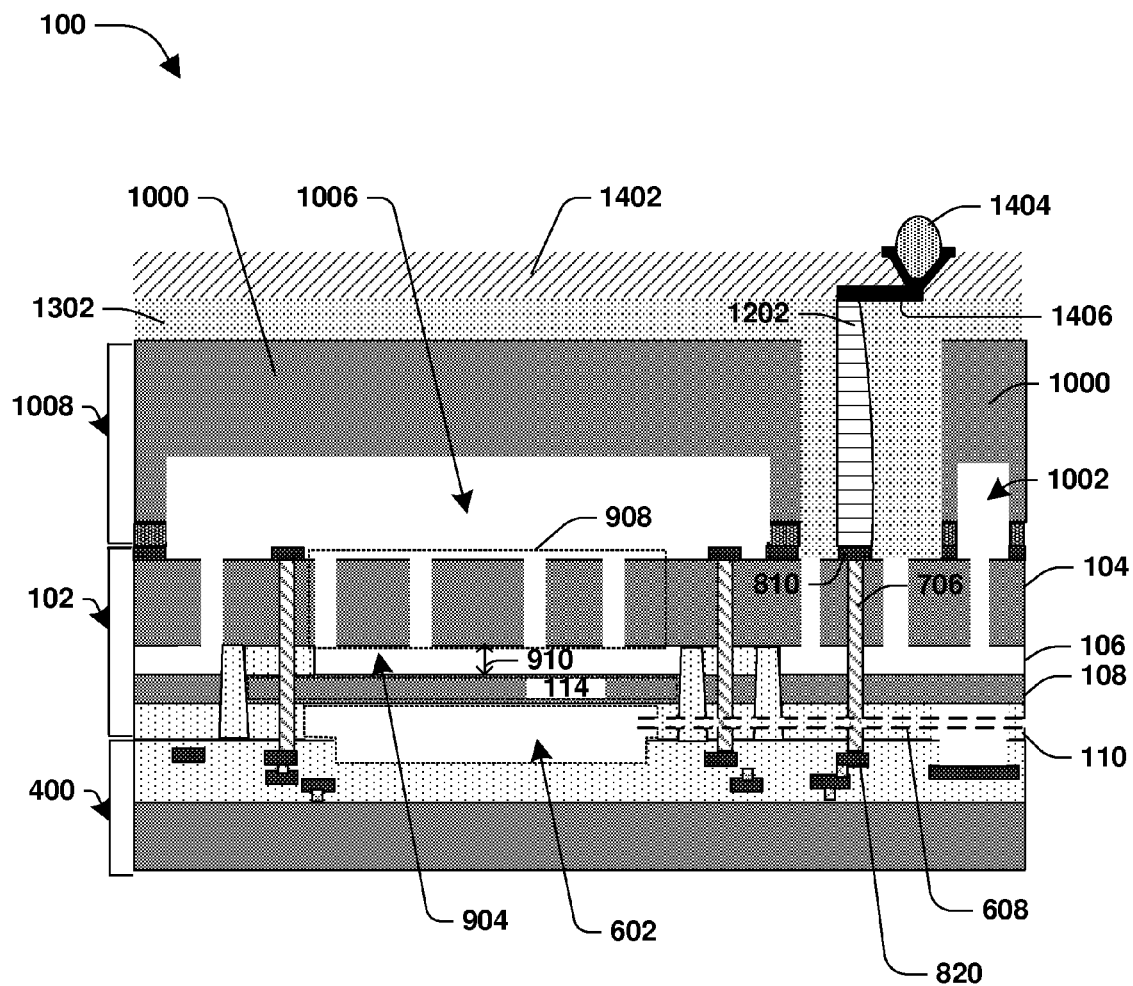
FIG. 14 is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 14, a second buffer layer 1402 is formed over the first buffer layer 1302. In some embodiments, the second buffer layer 1402 comprises a polybenzoxazole material. A connectivity structure 1404 is formed over the cap wafer 1008, such as over or into the second buffer layer 1402. In some embodiments, the connectivity structure 1404 comprises metal, such as a solder ball. In some embodiments, an under bump metallization (UBM) structure is used for the connectivity structure 1404. In some embodiments, the connectivity structure 1404 is electrically connected by a redistribution layer (RDL) connection 1406 to the metal connection 1202. In some embodiment, the connectivity structure 1404 is utilized as a redistribution layer to the CMOS wafer 400, such as through the metal connection 1202, the fifth metal structure 810, the third tungsten plug 706, and the third CMOS metal structure 820.

Figure 15A:
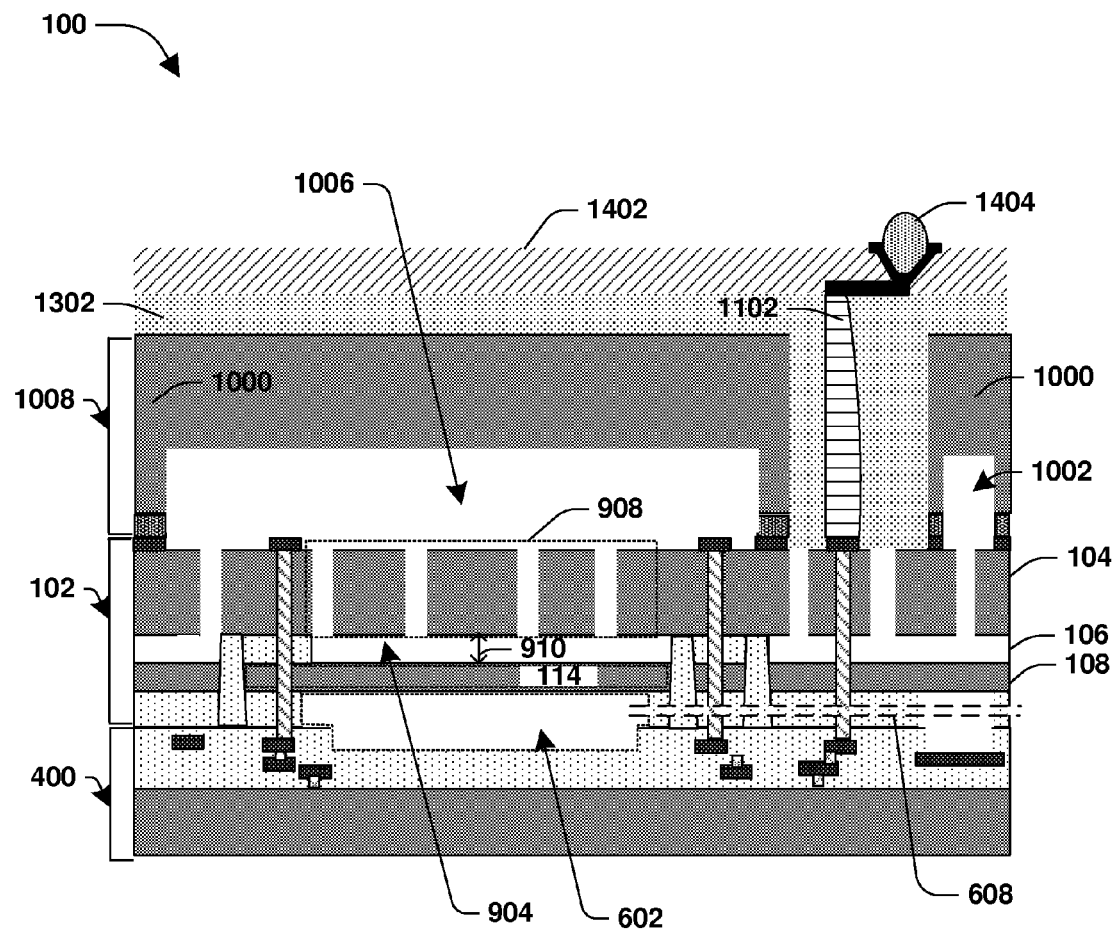
FIG. 15A is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 15B:
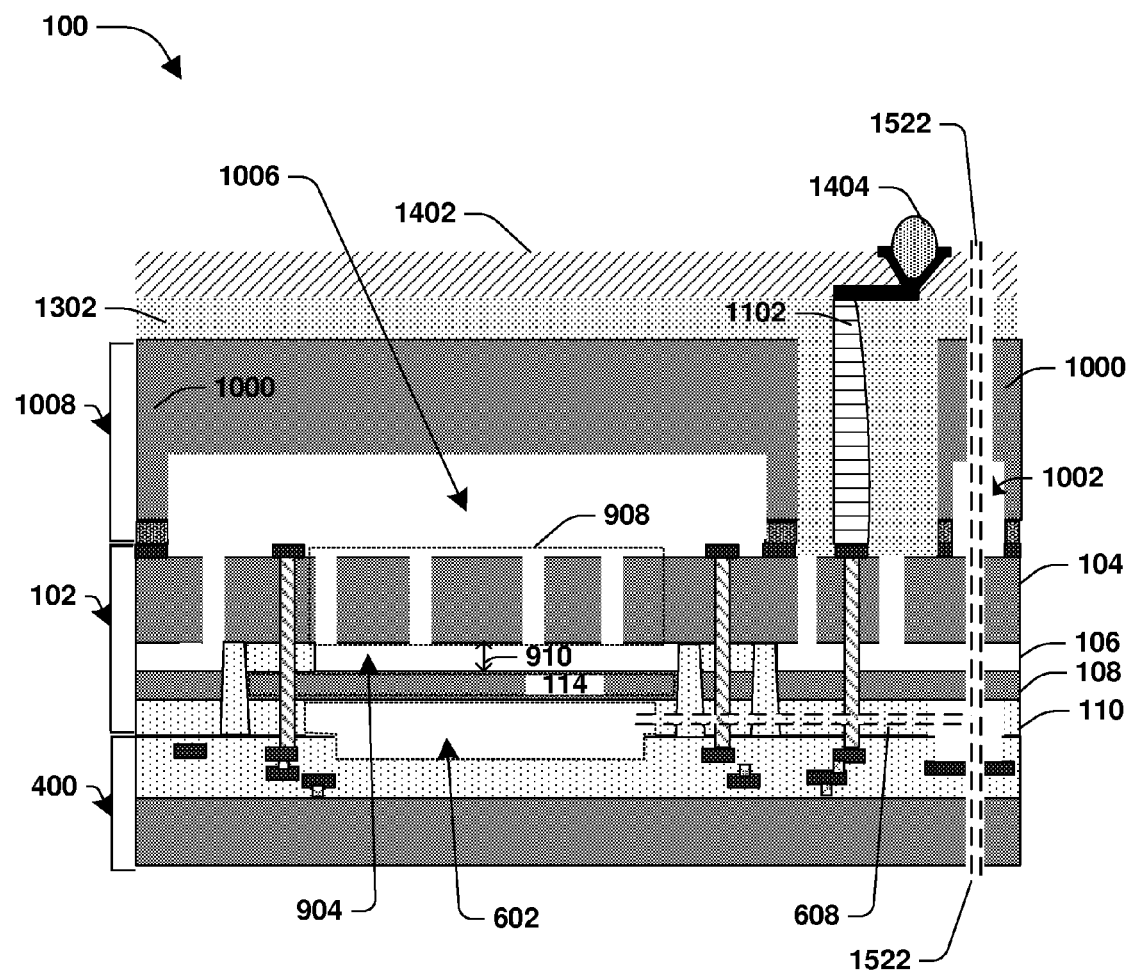
FIG. 15B is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 15C:
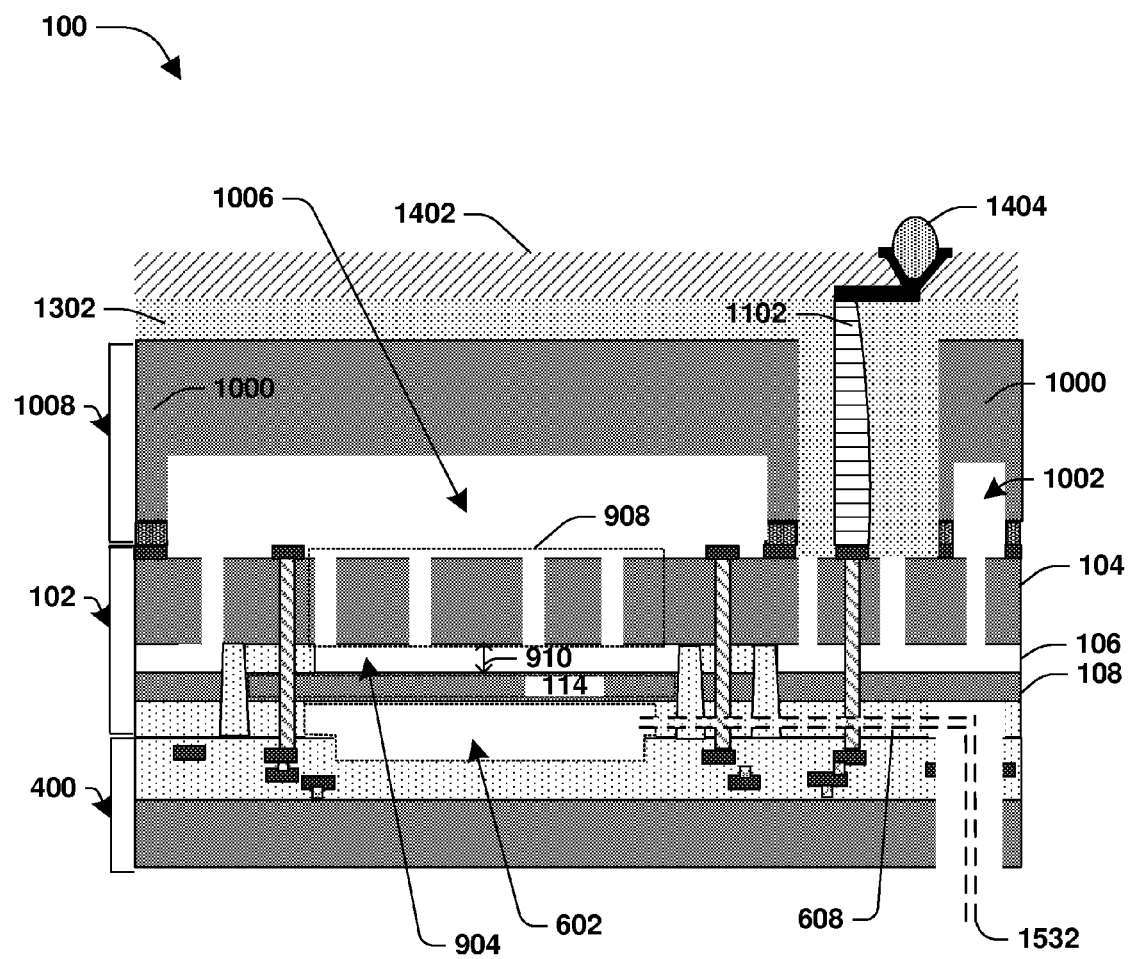
FIG. 15C is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 15D:
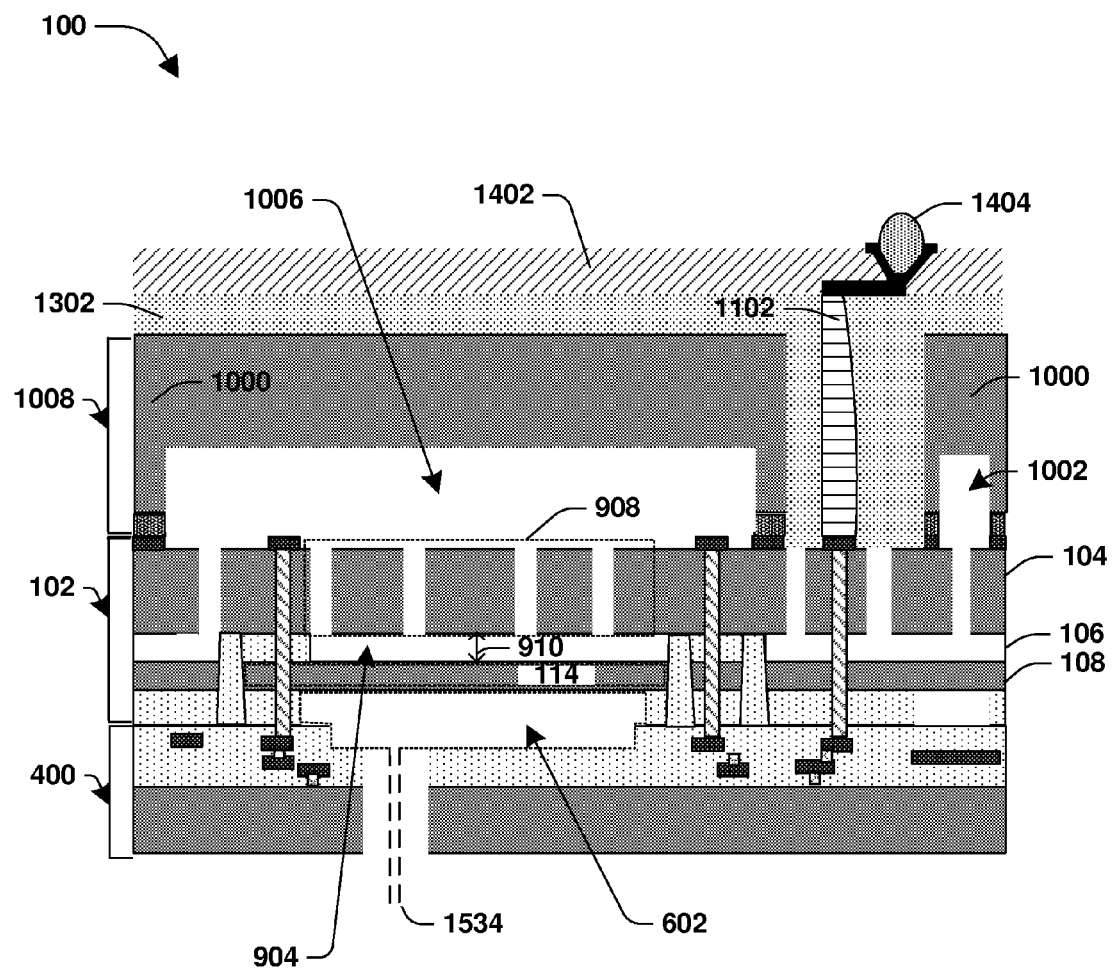
FIG. 15D is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 15A, the ambient pressure chamber 602 is exposed to ambient air through the ambient pressure channel 608 formed between the MEMS wafer 102 and the CMOS wafer 400, in accordance with some embodiments. As illustrated in FIG. 15B, at least one of a laser removal process or a dicing removal process is performed to form a second ambient pressure channel 1522 through the cap wafer 1008, the MEMS wafer 102, and the CMOS wafer 400 to ambient air, in accordance with some embodiments. The ambient pressure chamber 602 is exposed to ambient air through the ambient pressure channel 608 and the second ambient pressure channel 1522. As illustrated in FIG. 15C, a portion of the CMOS wafer 400 is removed to form an ambient pressure channel 1532, in accordance with some embodiments. The ambient pressure chamber 602 is exposed to ambient air through the ambient pressure channel 608 and the ambient pressure channel 1532. As illustrated in FIG. 15D, a portion of the CMOS wafer 400 is removed to form an ambient pressure channel 1534, in accordance with some embodiments. The ambient pressure chamber 602 is exposed to ambient air through the ambient pressure channel 1534.

Figure 15E:
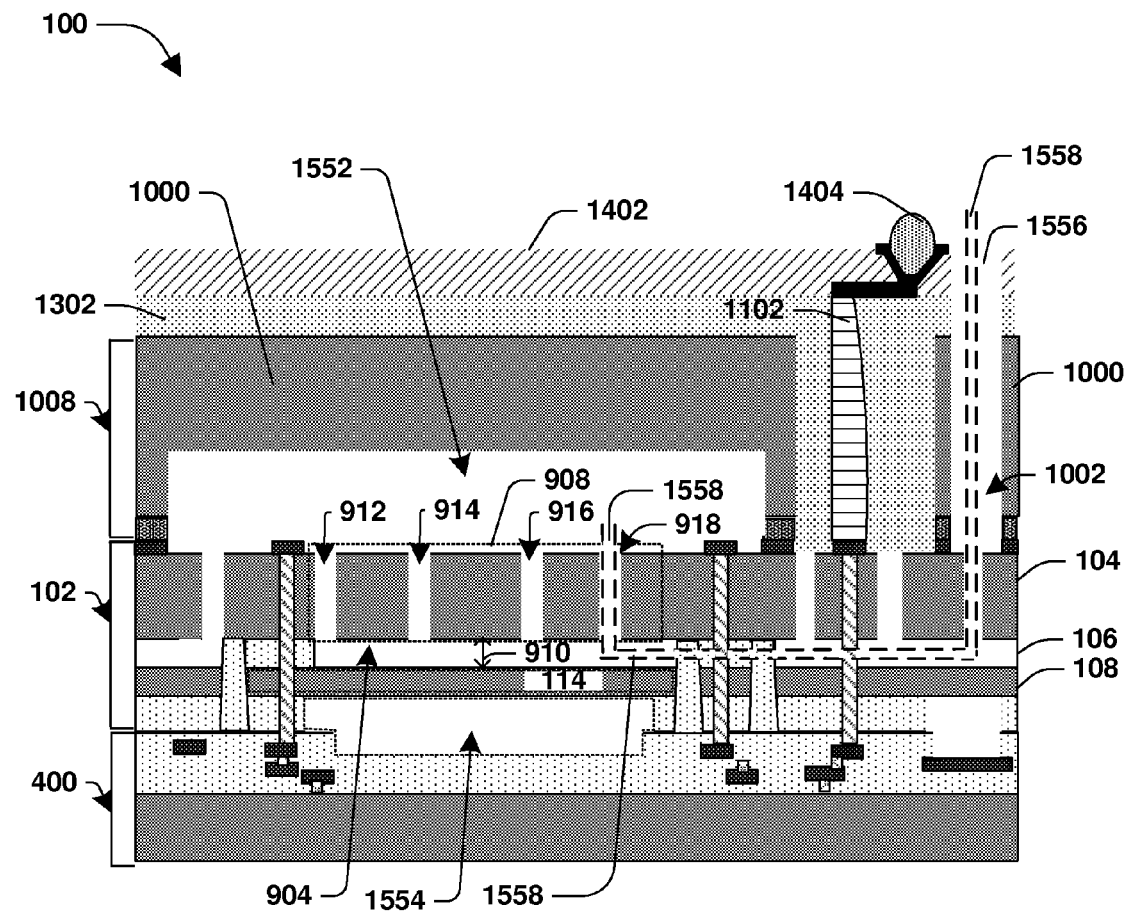
FIG. 15E is an illustration of a semiconductor arrangement comprising a microelectromechanical systems (MEMS) wafer bonded to a complementary metal-oxide-semiconductor (CMOS) wafer and to a cap wafer, in accordance with some embodiments.

As illustrated in FIG. 15E, a pressurized chamber 1554 is formed between the MEMS wafer 102 and the CMOS wafer 400, in accordance with some embodiments. An ambient pressure chamber 1552 is formed within the cap wafer 1008, such as between the sensing layer 908 and the silicon layer 1000. The ambient pressure chamber 1552 is open to the thermal insulator air gap 904, such as through the second via 912, the third via 914, the fourth via 916, and the fifth via 918. The ambient pressure chamber 1552 is exposed to ambient air through an ambient air channel 1558. In some embodiments, the ambient air channel 1558 is formed horizontally through the first oxide layer 106, and is formed vertically through the MEMS wafer 102 and the cap wafer 1008. In some embodiments, at least a portion of the ambient air channel 1558 is formed by a laser drilling process.

Various operations of embodiments are provided herein. The order in which some or all of the operations are described should not be construed as to imply that these operations are necessarily order dependent. Alternative ordering will be appreciated by one of ordinary skill in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a semiconductor arrangement is provided. The semiconductor arrangement comprises a complementary metal-oxide-semiconductor (CMOS) wafer. The semiconductor arrangement comprises a microelectromechanical systems (MEMS) wafer formed over the CMOS wafer. The MEMS wafer comprises a thermal insulator air gap between a sensing layer and a membrane. The semiconductor arrangement comprises an ambient pressure chamber formed between the CMOS wafer and the membrane of the MEMS wafer. The semiconductor arrangement comprises a cap wafer formed over the MEMS wafer. The cap wafer comprises a pressurized chamber having a pressure different than an ambient air pressure.

According to an aspect of the instant disclosure, a semiconductor arrangement is provided. The semiconductor arrangement comprises a complementary metal-oxide-semiconductor (CMOS) wafer. The semiconductor arrangement comprises a microelectromechanical systems (MEMS) wafer formed over the CMOS wafer. The MEMS wafer comprises a thermal insulator air gap between a sensing layer and a membrane. The semiconductor arrangement comprises pressurized chamber formed between the CMOS wafer and the membrane of the MEMS wafer. The pressurized chamber has a pressure different than an ambient air pressure. The semiconductor arrangement comprises a cap wafer formed over the MEMS wafer. The cap wafer comprises an ambient pressure chamber exposed to ambient air through the thermal insulator air gap.

According to an aspect of the instant disclosure, a method for forming a semiconductor arrangement is provided. The method comprises forming a microelectromechanical systems (MEMS) wafer comprising a thermal insulator air gap between a sensing layer and a membrane. The MEMS wafer is bonded to a complementary metal-oxide-semiconductor (CMOS) wafer. An ambient pressure chamber is formed between the CMOS wafer and the membrane of the MEMS wafer. The ambient pressure chamber is exposed to ambient air. A cap wafer is bonded to the MEMS wafer. The cap wafer comprises a pressurized chamber having a pressure different than an ambient air pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor arrangement, comprising:
    forming a microelectromechanical systems (MEMS) wafer comprising a thermal insulator air gap between a sensing layer and a membrane;
    bonding the MEMS wafer to a complementary metal-oxide-semiconductor (CMOS) wafer;
    forming an ambient pressure chamber between the CMOS wafer and the membrane of the MEMS wafer, the ambient pressure chamber exposed to ambient air; and
    bonding a cap wafer to the MEMS wafer, the cap wafer comprising a pressurized chamber having a pressure different than an ambient air pressure.

2. The method of claim 1, comprising:
    forming a first buffer layer over a silicon layer of the cap wafer; and
    forming a metal connection between the MEMS wafer and a connectivity structure over the cap wafer, the metal connection formed between a first portion of the first buffer layer and a second portion of the first buffer layer.

3. A semiconductor arrangement, comprising:
    a complementary metal-oxide-semiconductor (CMOS) wafer;
    a microelectromechanical systems (MEMS) wafer formed over the CMOS wafer, the MEMS wafer comprising a first thermal insulator air gap between a sensing layer and a membrane;
    an ambient pressure chamber formed between the CMOS wafer and the membrane of the MEMS wafer; and
    a cap wafer formed over the MEMS wafer, the cap wafer comprising a pressurized chamber having a pressure different than an ambient air pressure.

4. The semiconductor arrangement of claim 3, the ambient pressure chamber configured as a second thermal insulator air gap between the CMOS wafer and the membrane.

5. The semiconductor arrangement of claim 3, the pressurized chamber exposed to the first thermal insulator air gap through one or more channels formed through the sensing layer.

6. The semiconductor arrangement of claim 3, the first thermal insulator air gap configured as a sensing gap configured to sense movement of the membrane.

7. The semiconductor arrangement of claim 6, the sensing gap formed between a first sensing plate coupled to the sensing layer and a second sensing plate coupled to the membrane.

8. The semiconductor arrangement of claim 7, the first sensing plate and the second sensing plate configured to provide capacitance information used to determine at least one of compression or decompression of the sensing gap.

9. The semiconductor arrangement of claim 3, the first thermal insulator air gap configured to insulate the MEMS wafer from heat originating from the CMOS wafer.

10. The semiconductor arrangement of claim 4, the second thermal insulator air gap configured to insulate the MEMS wafer from heat originating from the CMOS wafer.

11. The semiconductor arrangement of claim 3, comprising:
    an ambient pressure channel formed between the MEMS wafer and the CMOS wafer, the ambient pressure channel exposing the ambient pressure chamber to ambient air.

12. The semiconductor arrangement of claim 3, the CMOS wafer comprising:
    an ambient pressure channel formed through the CMOS wafer to ambient air, the ambient pressure channel exposing the ambient pressure chamber to the ambient air.

13. The semiconductor arrangement of claim 3, comprising:
    a first ambient pressure channel formed between the MEMS wafer and the CMOS wafer; and
    a second ambient pressure channel formed through the CMOS wafer to ambient air, the first ambient pressure channel and the second ambient pressure channel exposing the ambient pressure chamber to ambient air.

14. The semiconductor arrangement of claim 3, comprising:
    a first ambient pressure channel formed between the MEMS wafer and the cap wafer; and
    a second ambient pressure channel formed through the cap wafer, the MEMS wafer, and CMOS wafer, the first ambient pressure channel and the second ambient pressure channel exposing the ambient pressure chamber to ambient air.

15. The semiconductor arrangement of claim 3, the cap wafer comprising:
    a metal connection between the MEMS wafer and a connectivity structure formed over the cap wafer.

16. The semiconductor arrangement of claim 3, comprising:
    a first buffer layer formed over a silicon layer of the cap wafer.

17. The semiconductor arrangement of claim 16, comprising:
    a second buffer layer formed over the first buffer layer.

18. The semiconductor arrangement of claim 17, the first buffer layer comprising a molding material, the second buffer layer comprising a polybenzoxazole material.

19. The semiconductor arrangement of claim 16, comprising:
    a metal connection between the MEMS wafer and a connectivity structure formed over the cap wafer, the metal connection formed between a first portion of the first buffer layer and a second portion of the first buffer layer.

20. A semiconductor arrangement, comprising:
    a complementary metal-oxide-semiconductor (CMOS) wafer;
    a microelectromechanical systems (MEMS) wafer formed over the CMOS wafer, the MEMS wafer comprising a thermal insulator air gap between a sensing layer and a membrane;

a pressurized chamber formed between the CMOS wafer and the membrane of the MEMS wafer, the pressurized chamber having a pressure different than an ambient air pressure; and a cap wafer formed over the MEMS wafer, the cap wafer comprising an ambient pressure chamber exposed to ambient air through the thermal insulator air gap.

\* \* \* \* \*